United States Patent [19]

Kornfeld et al.

[11] Patent Number: 5,442,322

[45] Date of Patent: Aug. 15, 1995

[54] POWER AMPLIFIER BIAS CONTROL CIRCUIT AND METHOD

[75] Inventors: Richard K. Kornfeld, San Diego; Ana L. Weiland, Encinitas, both of Calif.; Mitsunari Okazaki, Fukushima, Japan

[73] Assignees: Alps Electric Co.; Qualcomm Inc., Japan

[21] Appl. No.: 315,540

[22] Filed: Sep. 30, 1994

Related U.S. Application Data

[63] Continuation of Ser. No. 37,764, Mar. 26, 1993, abandoned.

[51] Int. Cl.6 .............................................. H03G 3/30
[52] U.S. Cl. ...................................... 330/285; 330/133
[58] Field of Search ............... 330/130, 131, 133, 285, 330/129, 279

[56] References Cited

U.S. PATENT DOCUMENTS

| 3,514,710 | 5/1970 | Janning, Jr. | 330/285 |
|---|---|---|---|
| 4,041,396 | 8/1977 | Fedde | 325/150 |
| 4,158,180 | 6/1979 | Challen | 330/298 |
| 4,320,350 | 3/1982 | Drapac | 330/202 |
| 4,447,783 | 5/1984 | Quick | 323/275 |
| 4,495,648 | 1/1985 | Giger | 455/73 |
| 4,510,460 | 4/1985 | Tamura | 330/285 |
| 4,523,155 | 6/1985 | Walczak et al. | 330/279 |
| 4,578,603 | 3/1986 | McPherson | 330/279 |
| 4,593,409 | 6/1986 | Miller | 455/73 |
| 4,602,218 | 7/1986 | Vilmur et al. | 330/279 |
| 4,613,990 | 9/1986 | Halpern | 455/33 |
| 4,654,882 | 3/1987 | Ikeda | 455/88 |
| 4,709,403 | 11/1987 | Kikuchi | 455/126 |
| 4,723,304 | 2/1988 | Maeda | 455/69 |
| 4,797,632 | 1/1989 | Guery | 330/285 |
| 4,870,698 | 9/1989 | Katsuyama et al. | 455/67 |
| 5,029,298 | 7/1991 | Chiba | 330/285 |
| 5,083,096 | 1/1992 | Miyazaki | 330/279 |
| 5,107,225 | 4/1992 | Wheatley et al. | 330/279 |
| 5,132,634 | 7/1992 | Suarez | 330/279 |
| 5,146,180 | 9/1992 | Hyakutake | 330/279 |

OTHER PUBLICATIONS

Textbook *Microelectronics Circuits*, 2nd Edition; A. S. Sedra, K. C. Smith; HRW, Inc. New York, N.Y. 1987.

*Primary Examiner*—Steven J. Mottola
*Assistant Examiner*—Tiep H. Nguyen
*Attorney, Agent, or Firm*—Guy W. Shoup; Norman R. Klivans

[57] ABSTRACT

A control circuit for a multi-stage power amplifier (such as in a portable radio transmitter) compensates for fluctuations in ambient temperature, load, signal level and power supply voltage. The control voltage is set by comparing a biasing level which is related to the amplifier input signal level to a voltage proportional to the power supply current of the last stage of the amplifier. The control voltage resulting from the comparison establishes the operating point of the last stage of the power amplifier.

21 Claims, 4 Drawing Sheets

POWER AMPLIFIER BIAS CONTROL CIRCUIT AND METHOD

This application is a continuation of application Ser. No. 08/037,764, filed Mar. 26, 1993, now abandoned.

BACKGROUND OF THE INVENTION

1. Field of the Invention

This invention relates to controlling the gain of RF power amplifiers. Specifically, an FET power amplifier is caused to have substantially constant operating characteristics by maintaining the amplifier current constant for a given output power in spite of fluctuations in ambient temperature, load, and supply voltage.

2. Description of the Prior Art

FIG. 1 illustrates a prior art transmission circuit of a radio transmitter (e.g., a battery powered transmitter such as an automobile telephone). Amplifier stages 1, 2, 3 are each conventional FET (field effect transistor) amplifiers including first stage pre-amplifier 1, second stage driver amplifier 2 and final stage amplifier 3. A common power supply voltage $V_{DD}$ is provided from a terminal 4 to the drain terminals of amplifier stages 1, 2, and 3. A fixed gate bias voltage $V_G$ is provided from terminal 5 to the gate terminals of amplifier stages 1, 2. An example of such an amplifier is the Fujitsu FMC080802-21 power amplifier.

An RF (radio frequency) signal Sig In is provided at input terminal 6 to the first amplifier stage 1. Sig In is amplified to a predetermined level sequentially by amplifier stages 1, 2, 3; the output of stage 3 is transmitted by antenna 7 to a receiver (not shown). A bias control voltage provided at terminal 8 to the gate terminal of final stage amplifier 3 has a magnitude controlled by additional circuitry (not shown) typically to be constant, or is varied to be a function of the level of Sig In. Specifically, when the level of Sig In is small, the bias control voltage is varied to shift the operating point of amplifier stage 3 to reduce the drain current of stage 3. This bias control decreases power consumption of the amplifier and is well known in the field of battery powered portable telephones.

Generally, the gain of the amplifier of FIG. 1 is a function of ambient temperature. When the temperature rises, the drain current of the FET in each stage is reduced, causing a subsequent decrease in gain. This is shown in FIG. 2 which is an operating characteristic diagram showing the relation of gain and drain current versus bias control voltage in the power amplifier of FIG. 1 at two temperatures. Curve $G_1$ of FIG. 2 shows gain in dB (vertical axis) versus bias control voltage (horizontal axis) at room temperature. Curve $I_{D1}$ indicates variation in the drain current in mA at room temperature as a function of control voltage. Points A and C indicate gain and current at maximum transmission power (bias control voltage a), and points B and D represent gain and current at minimum transmission power (bias control voltage b). At point B, where transmission power is at a minimum, the drain current drawn (and hence power consumed) by the amplifier are also at a minimum. As transmission power is increased, the drain current must also be increased to prevent saturation and therefore loss of linearity and gain of the amplifier.

Curves $G_2$ and $I_{D2}$ are the operating characteristic diagram of the amplifier of FIG. 1 at an increased ambient temperature, corresponding to respectively curves $G_1$ and $I_{D1}$ at room temperature. Point B' on curve G2 represents the gain of the amplifier at minimum transmission power, and point D' on curve $I_{D2}$ represents the drain current at minimum transmission power. Point A' on curve G2 represents the gain of maximum transmission power, and point C' on curve $I_{D2}$ represents current at maximum transmission power.

The reduction in both gain and current is readily seen by comparing points A, B, C, D at room temperature to points A', B', C', D' respectively at the increased temperatures.

FIGS. 3a–3d illustrate the mechanisms which cause the fluctuations seen in FIG. 2. FIGS. 3a and 3b are characteristic diagrams of the drain voltage (horizontal axis) versus the drain current (vertical axis) as a function of gate voltage of the FET in amplifier stage 3. In amplifier stage 3, a load curve operating point is determined by the gate voltage and drain voltage so as not to cause saturation at maximum transmission power. Different drain and gate voltages cause different drain currents, and hence different operating points.

FIG. 3a represents the maximum transmission operating point at room temperature. The gate bias voltage $V_G$ chosen must correspond to a relatively large drain current so that the desired maximum transmission power can be achieved. FIG. 3b represents the minimum transmission operating point at room temperature where the large current drawn is no longer necessary to achieve the desired output power. In order to reduce the D.C. power drawn by the amplifier, the gate bias voltage ($V_G$) has been decreased. The maximum peak RF output voltage is represented by the intersection of the load curve of the drain voltage axis. The reduction in maximum transmission power between the two operating points can be seen by noting that in FIG. 3a the intersection point is $V_{D4}$, while in FIG. 3b the intersection point is $V_{D1}$ which is lower than $V_{D4}$. This reduction also corresponds to the loss of gain as the gate bias voltage is lowered.

FIG. 3c represents the maximum transmission operating point at an increased temperature. Notice, compared to FIG. 3a, that given the same gate bias voltage ($V_G$) the drain current has decreased and the maximum peak RF output voltage (as indicated by the intersection of the load curve to the drain voltage axis) has also decreased. The reason for the changes is that due to the increase in temperature, the load curve of FIG. 3c has moved parallel to the original load curve toward the intersection of the drain voltage and drain current axis. This change with respect to temperature is a general characteristic of all FET's.

FIG. 3d represents the minimum transmission operating point at an increased temperature. Similarly the maximum transmission point and reduction in current and maximum peak RF transmission voltage can be seen by comparing FIG. 3d to FIG. 3b.

The above diagrams and description deal with an increase in ambient temperature; the inverse situation occurs for an ambient temperature decrease.

As described above, fluctuations in ambient temperature cause variations in the drain current, which in turn cause variations in gain in prior art amplifiers. There is a strong correlation between variations in gain and variations in amplifier FET drain current as well as saturation point. Such variations in gain are undesirable in a cellular telephone system. In a digital cellular telephone system such as a CDMA system, it is required that a signal received at the base station be controlled with great accuracy to achieve maximum capacity of the system. It is therefore undesirable that transmitter gain vary with temperature.

Gain also varies due to fluctuations both in the power supply voltage and in the load. In such cases, there is also a strong correlation between variation in gain and variation in the drain current, so these variations can be compensated for in the same manner as the temperature variation.

SUMMARY OF THE INVENTION

The final amplifier stage of a multi-stage FET amplifier is provided with a bias control voltage which corresponds to the level of the first stage input RF signal or alternatively to the desired RF transmission output power.

In accordance with the present invention, an apparatus and method control the operating point of a field effect transistor (FET) amplifier. Particularly when the FET amplifier is operating over a large dynamic range where the maximum power generated is significant and yet current consumption is critical, the present invention affords an advantage over the prior art. In accordance with the present invention, there is direct control of the drain current of an FET stage (typically the last stage) in order to retain high efficiency without saturation over fluctuations in temperature, output load match, and drain voltage. The increased stability is achieved through current control, because current consumption is the single most stable parameter in determining the operating point of a FET stage over varying conditions.

In accordance with the present invention, circuitry for controlling the current drawn by an FET amplifier includes a current detector and an integrator. The current detector generates a signal proportional to FET amplifier drain current, and typically is coupled in series with a D.C. power source to the drain terminal of the FET amplifier. The integrator receives two inputs: the current detector signal and a reference signal which corresponds to a predetermined amplifier current consumption for the present operating conditions. The integrator outputs a control signal which is coupled to the gate (control) terminal of the FET amplifier. The control signal at the gate terminal in turn directly controls the FET amplifier operating point, and hence, the drain current, of the FET amplifier given a fixed temperature, output load match, and drain voltage. In this manner, the current of the FET amplifier is controlled in a closed loop by indirectly controlling the signal applied to the gate terminal of the FET amplifier.

The reference signal can vary continuously as a function of input or output RF power, or may be a series of step functions based on a set of input or output RF power thresholds. The reference signal corresponds to a current sufficient to keep the FET amplifier from saturating at high output RF power, while limiting the current for increased efficiency at low output RF power.

DETAILED DESCRIPTION OF THE INVENTION

Figure 1:
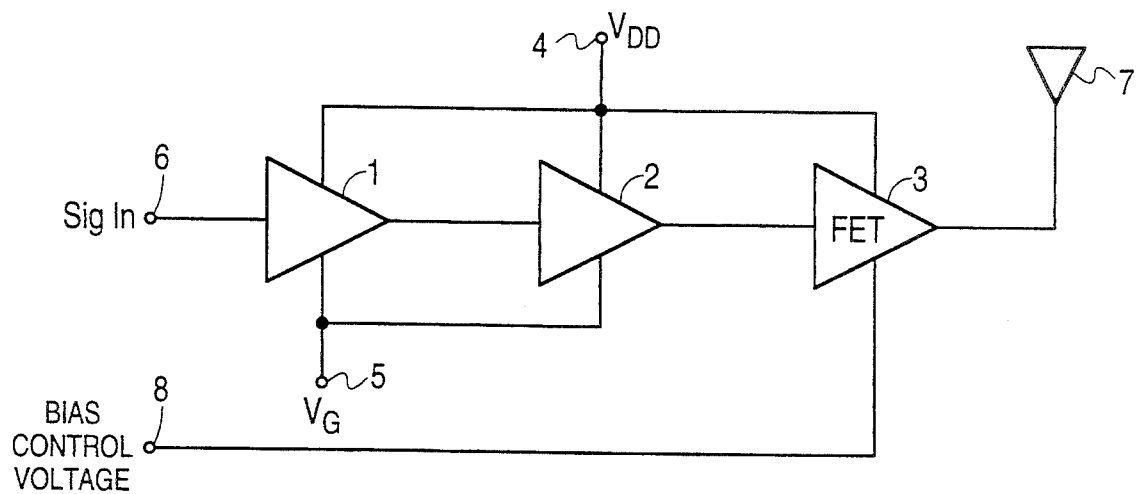
FIG. 1 shows a prior art power amplifier.
Figure 2:
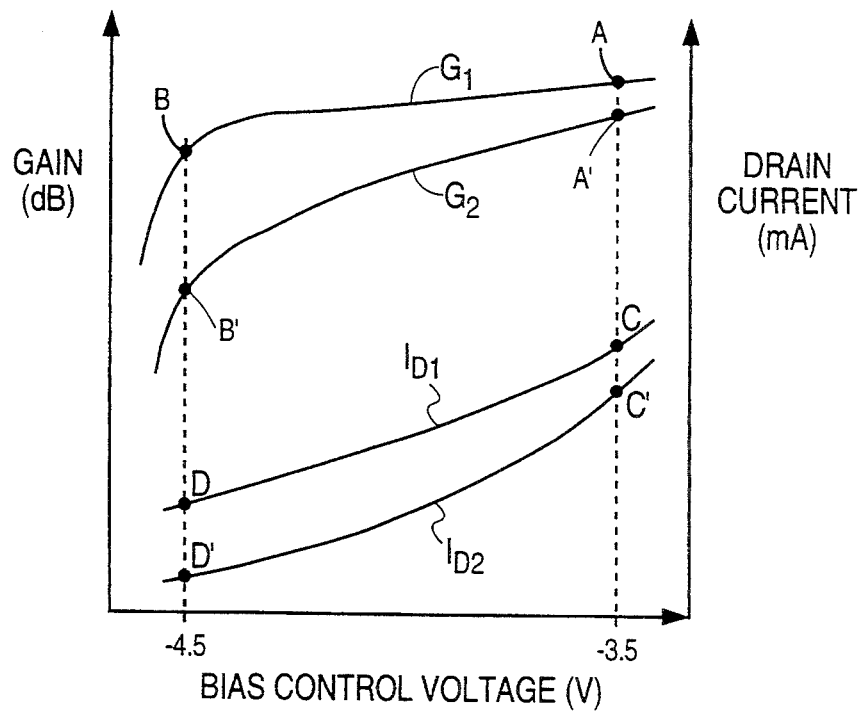
FIG. 2 shows operating characteristics for the amplifier of FIG. 1.
Figure 3A:
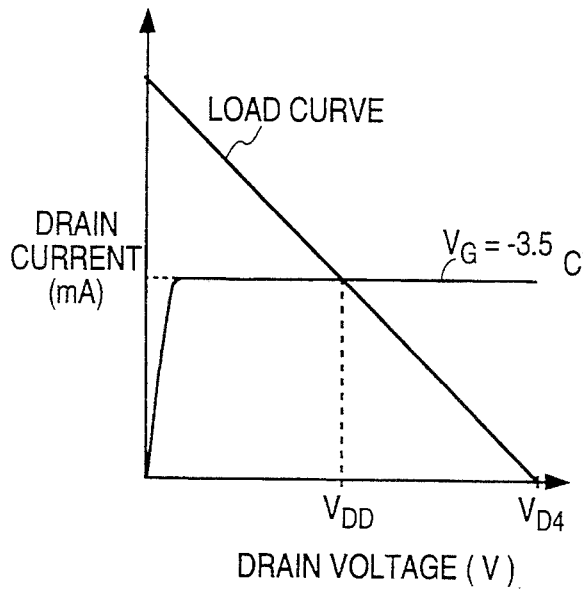
FIGS. 3a to 3d show further operating characteristics for the amplifier of FIG. 1.
Figure 3C:
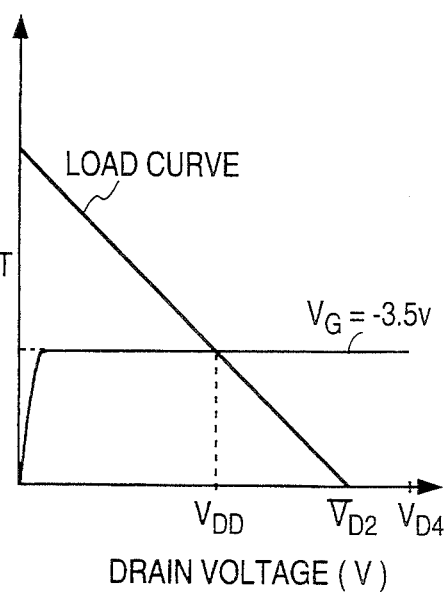
Figure 3B:
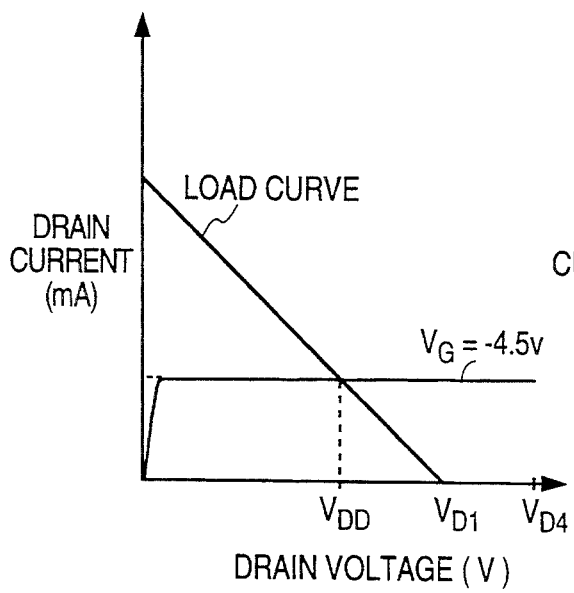
Figure 3D:
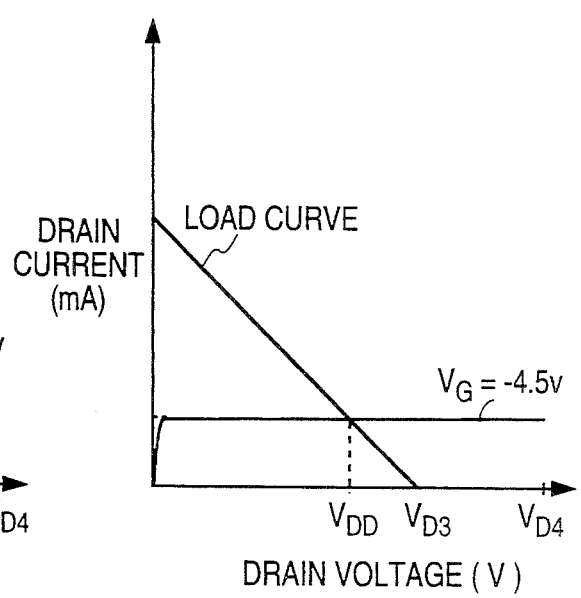
Figure 4:
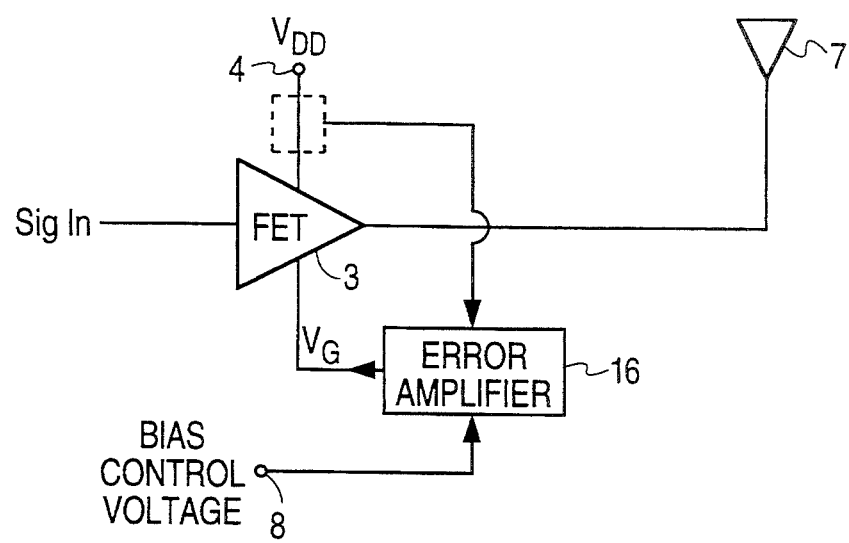
FIG. 4 shows a power amplifier in accordance with the present invention.

FIG. 4 shows stage 3 of a power amplifier as in FIG. 1. In accordance with the invention, current detector 9 detects the current flowing to the drain terminal of the stage 3 FET, and provides a signal αI (indicative of the drain current) to one input terminal of an error amplifier 16, the other input terminal of which receives the bias control voltage from terminal 8. Error amplifier 16 then outputs a control signal (the result of comparing its two input signals) to the gate terminal G of stage 3, thereby controlling the operating point of stage 3.

Figure 5:
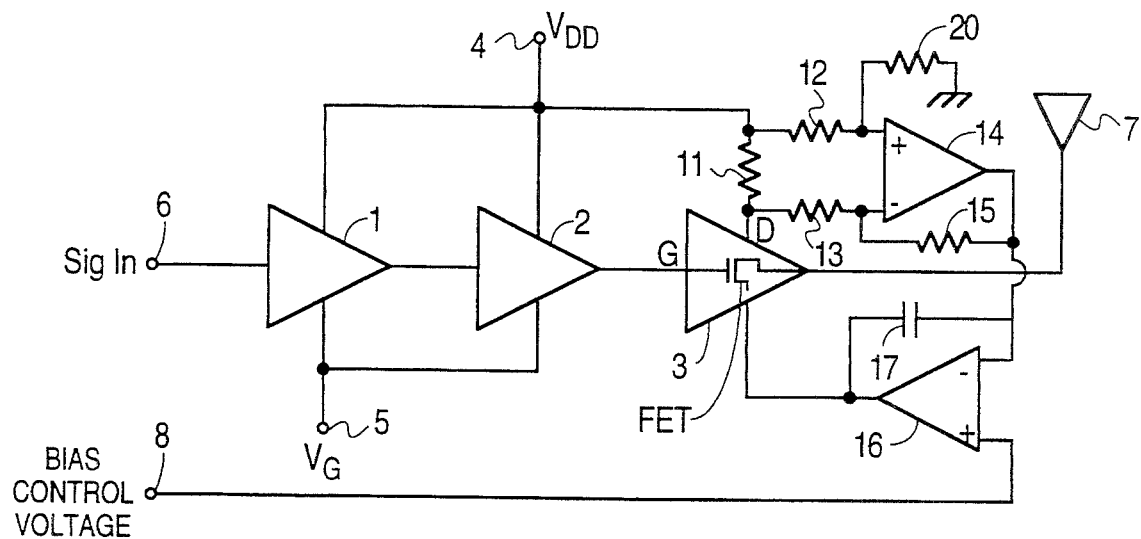
FIG. 5 shows detail of the power amplifier of FIG. 4.

FIG. 5 shows one embodiment of the present invention including detail in addition to that of FIG. 4. (Each stage 1, 2, 3 is identical to the corresponding prior art stages depicted in FIG., 1.) Power supply voltage $V_{DD}$ is supplied via resistor 11 to the drain terminal D of stage 3. The voltage across resistor 11 is proportional to the drain current to stage 3. Resistor 11 thus detects the current flowing to the FET drain terminal of stage 3, and has in one embodiment a resistance value equal to or smaller than 1 ohm (typically being 0.1 ohm), to minimize the resulting drop in the voltage supplied to the drain terminal (i.e., minimize power dissipation in the detection resistor 11).

Voltages at each end of resistor 11 are supplied via resistors 12, 13 to respectively the non-inverting and inverting terminals of op amp (operational amplifier) 14, which is a typical op amp. Resistors 12, 13, 15 and 20 determine the gain of op amp 14. In the general case, if the resistance R11 of resistor 11 is much less than resistances R12, R13 of respectively resistors 12, 13:

$$V_{out} = -\frac{R15}{R13}\left[V_{DD}\text{applied} - \frac{1}{\frac{R12}{R20}+1}\left(\frac{R13}{R15}+1\right)V_{DD}\right]$$

where:
$V_{DD}$ = drain supply voltage
$V_{DD}$applied = output of R11, input to stage 3.

In one embodiment, resistance R12 of resistor 12 is equal to the resistance R13 of resistor 13, and the resistance R20 of resistor 20 is equal to the resistance R15 of resistor 15, and Vout = $-(R15/R13)\Delta$, where $\Delta$ is equal to the drop across resistance R11.

In order to determine the values of R12, R13, R15 and R20, the desired control voltage versus output power versus drain current is determined; this relation varies between applications. In one example, for a 10-fold gain, resistor 13 is 10K ohms and resistor 15 is 100K ohms.

The output signal of op amp 14 is input, together with the externally provided bias control voltage, to respectively the inverting and non-inverting terminals of op amp (error amplifier) 16. Capacitor 17 is connected between the inverting terminal and the output terminal of op amp 16, so that op amp 16 serves an integrator.

Op amp 16 controls the gate voltage, and hence indirectly the drain current, of stage 3. When the feedback loop is closed, the output signal of op amp 14, which is proportional to the drain current of stage 3, will be equal to the control voltage. The values of resistors 12, 13, 15 and 20 are chosen so that the desired relationship between control voltage and the stage 3 drain current is achieved.

The control voltage input to amplifier stage 3 is related to the desired output RF power from amplifier stage 3. The output signal of op amp 16 is input to the gate (control) terminal of the FET of amplifier stage 3 as the control voltage.

In this configuration, the control voltage from amplifier 16 indirectly controls the current drawn by stage 3 of the amplifier by directly controlling the gate voltage of stage 3. Since the current versus load curve changes much less over temperature, load variation, and drain voltage than does the gate voltage versus load curve, the circuit as shown in FIG. 5 is more stable over these parameters than the prior art circuit of FIG. 1. A compensation circuit for restraining the temperature dependent variations in the gain of amplifier stage 3 is thereby provided by a feedback loop including amplifier stage 3 and op amps 14, 16.

In the following example, it is assumed that the level (amplitude) of Sig In to amplifier stage 1 is fixed (and therefore the externally provided bias control reference voltage related to the Sig In level is also fixed) and that the amplifier stage 3, and op amps 14, 16 configured for temperature compensation are in a closed loop state. "Closed loop state" means that the output of op amp 16 generates a gate voltage which results in a drain current that in turn generates an output signal from op amp 14 which is equal to the desired control voltage. In other words, the closed loop is working and the output of op amp 16 is somewhere in the middle of the range, not "railed" at one end of its range.

When the ambient temperature rises in this closed loop state, the subsequent variation in the control circuit is as follows:

(a) When the ambient temperature rises, the drain current is reduced, thus a decline in the gain results.
(b) The voltage at the inverting terminal of op amp 14 increases, due to a reduction in the current flowing through current detection resistor 11. Therefore, the output voltage of op amp 14 is reduced. At this time, balance between the two input voltages of op amp 16 is lost, and op amp 16 begins to integrate the difference in voltage at its inputs.
(c) The output signal of op amp 16 (connected to the FET gate of amplifier stage 3) increases, therefore the FET drain current increases. The increase in the drain current leads to a rise in the gain because of the absence of saturation, with a shift of the operating point on the load line.
(d) Actions the reverse to those of (a), (b) and (c) occur, and the loop settles to a new steady state closed loop condition.

Figure 6:
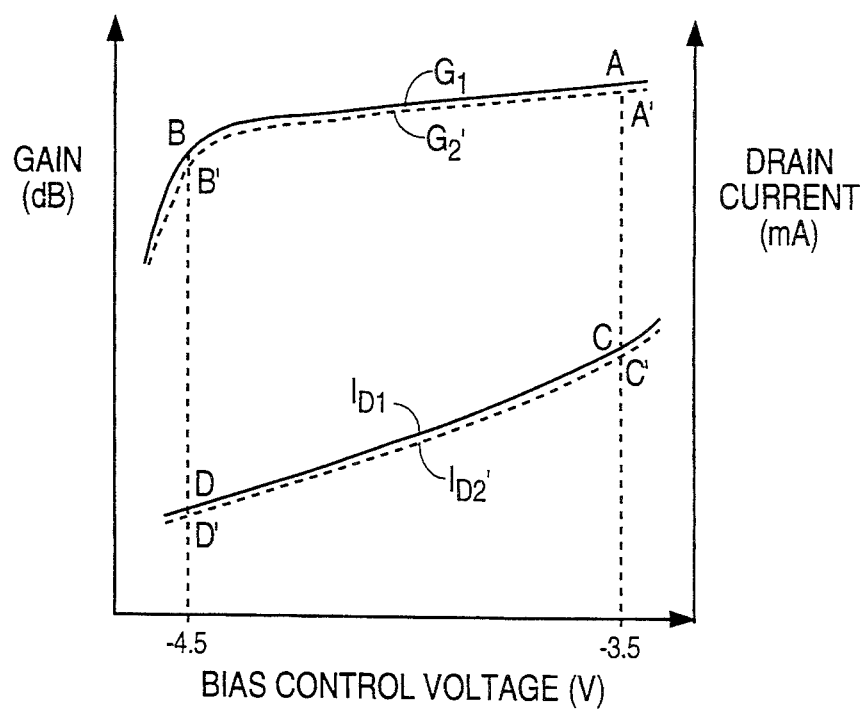
FIG. 6 shows operating characteristics for the amplifier of FIG. 5.

As a consequence of the above, the gain and the drain current at an elevated temperature are, as indicated by curves $G_2'$, $I_{D2}'$ in FIG. 6, substantially equal to a gain $G_1$ and a drain current $I_{D1}$ at room temperature, so that the influence of temperature is reduced.

The above description deals with the case where ambient temperature rises. In the case of a drop in ambient temperature, compensation is provided by complementary action.

Further, the present invention also overcomes variations caused by a variety of non-temperature factors influencing the FET operating point. For instance, fluctuations in the load and in the power supply voltage lead to the variations in the FET operating point. According to the present invention, such gain variations are compensated for.

Therefore, according to the present invention, it is possible to restrain variations in gain with respect to temperature and other fluctuations, while controlling the efficiency of the power amplifier. Controlling the other (two) stages of the amplifier is not critical since they do not draw as much current because they do not produce large RF output signal power. The earlier stages can be biased far from saturating at their RF output power, without sacrificing a significant amount of power.

The above description is illustrative and not limiting; the circuit and method in accordance with the invention are applicable to other types of amplifiers using FETs, and also to those using bipolar transistors, with appropriate modifications apparent to one of ordinary skill in the art. The invention is also not limited to RF amplifiers but applies to other types of analog amplifier such as baseband or AGC amplifiers.

We claim:

1. A power amplifier comprising:
   an FET amplifier stage having a power supply terminal and having an input terminal for receiving an externally provided variable amplitude signal and receiving a control signal at a control terminal;
   a current detector connected to said power supply terminal thereby detecting a power supply current provided to said power supply terminal of said FET amplifier stage, said current detector supplying a signal at an output terminal proportional to said power supply current; and
   a comparator having a first input terminal connected to a source of a reference signal and a second input terminal connected to the output terminal of said current detector, and providing in response said control signal to said amplifier stage.

2. The amplifier of claim 1, wherein said control signal sets an operating point of said FET amplifier stage.

3. The amplifier of claim 1, wherein said power supply terminal is also a drain terminal of said FET amplifier stage.

4. The amplifier of claim 1, wherein said current detector comprises a first resistance connected between said power supply terminal and a power source.

5. The amplifier of claim 4, wherein said current detector further comprises an operational amplifier having a first input terminal connected to a first end of said resistance and a second input terminal connected to a second end of said resistance.

6. The amplifier of claim 1, wherein said comparator comprises an operational amplifier.

7. The amplifier of claim 1, further comprising at least one additional amplifier stage for providing said externally provided variable amplitude signal to be amplified by said FET amplifier stage.

8. (Amended) The amplifier of claim 1, wherein said reference signal is related to a level of said externally provided variable amplitude signal.

9. A power amplifier comprising:
   an PET amplifier stage for amplifying an externally provided variable amplitude signal and having a control terminal;
   a detector for detecting a power supply current to said FET amplifier stage and providing a signal in response thereto; and a circuit for supplying a control signal to said control terminal of said FET amplifier stage, said control signal being at least partly determined by said signal provided by said detector;

wherein said detector comprises a resistance connected between a power supply source and a power supply terminal of said FET amplifier stage.

10. The power amplifier of claim 9, wherein said FET amplifier stage has a drain terminal connected to receive said power supply current, and said detector is connected to said drain terminal.

11. A power amplifier comprising:
an FET amplifier stage for amplifying an externally provided variable amplitude signal and having a control terminal;
a detector for detecting a power supply current to said FET amplifier stage and providing a signal in response thereto; and
a circuit for supplying a control signal to said control terminal of said FET amplifier stage, said control signal being at least partly determined by said signal provided by said detector;
wherein said control signal is determined by a signal related to an amplitude of said externally provided variable amplitude signal and by said signal provided by said detector.

12. The amplifier of claim 11, wherein said circuit for supplying said control signal comprises an operational amplifier and wherein said control signal is an output signal of said operational amplifier and wherein said operational amplifier receives two input signals, a first input signal being said signal related to the amplitude of said externally provided variable amplitude signal, and a second input signal being said signal provided by said detector.

13. A method for operating an amplifier for amplifying an externally provided variable amplitude input signal to provide a stable operating point over varying operating conditions and said amplifier having at least one FET amplifier stage, the operating point of said FET amplifier stage being determined by a signal applied to a control terminal of said FET amplifier stage, the method comprising the steps of:
providing said FET amplifier stage as having a particular level of gain corresponding to a particular level of a power supply current to said FET amplifier stage, said particular level of gain being independent of said varying operating conditions;
detecting a level of said power supply current to said FET amplifier stage;
providing a voltage which is proportional to said power supply current level;
providing a reference signal;
comparing said reference signal to said proportional voltage and generating a signal in response; and
applying the generated signal to said control terminal, wherein the generated signal causes said FET amplifier stage to operate at the stable operating point over said varying operating conditions.

14. The method of claim 13, wherein said reference signal is indicative of a predetermined operating point of said FET amplifier stage at a particular level of said externally provided variable amplitude input signal.

15. The method of claim 13, wherein the step of detecting comprises detecting at a drain terminal of said FET amplifier stage.

16. A method of operating an amplifier for amplifying an externally provided variable amplitude input signal, the amplifier having at least one FET amplifier stage which amplifies said externally provided variable amplitude input signal and having an operating point set by a control signal provided thereto, and having a particular level of gain corresponding to a particular level of a power supply current to said at least one FET amplifier stage, said particular level of gain being independent of operating conditions, the method comprising the steps of:
providing a first signal related to a level of said externally provided variable amplitude input signal;
providing a second signal related to said gain of said at least one FET amplifier stage;
comparing said first and second signals and generating a signal in response; and
applying said generated signal to said at least one FET amplifier stage as said control signal.

17. A steady operating point amplifier comprising:
an FET amplifier, having a drain terminal for receiving a supply current and for providing an output signal, and having a gate terminal coupled to receive an input signal and coupled to a control voltage;
means for providing an indication of a level of said supply current;
a terminal receiving a bias control signal indicating a desired operating point of said FET amplifier; and
means for comparing said bias control signal to said level indication and producing said control voltage, said control voltage thereby controlling the level of said supply current;
wherein a desired operating point of said FET amplifier is maintained constant over variations in operating conditions.

18. The steady operating point amplifier of claim 17, wherein said input signal has a variable amplitude and said bias control signal is a function of the amplitude of said input signal.

19. The steady operating point amplifier of claim 17, wherein said desired operating point of said FET amplifier indicates a first level of said supply current at a first amplitude of said input signal and indicates a second level of said supply current at a second amplitude of said input signal.

20. The steady operating point amplifier of claim 19, wherein said first level of said supply current is greater than said second level of said supply current and said first amplitude of said input signal is greater than said second amplitude of said input signal.

21. The steady operating point amplifier of claim 17, wherein said desired operating point designates a fixed gain, a fixed current consumption, and a fixed saturation point of said FET amplifier.

* * * * *

UNITED STATES PATENT AND TRADEMARK OFFICE
CERTIFICATE OF CORRECTION

PATENT NO.   : 5,442,322
DATED        : August 15, 1995
INVENTOR(S)  : Richard K. Kornfeld, Ana L. Weiland and Mitsunari Okazaki It is certified that error appears in the above-identified patent and that said Letters Patent is hereby corrected as shown below:

In the Claims, column 6, line 59, delete "(Amended)";

column 6, line 63, delete "PET" and insert --FET--;

column 7, line 42, delete the period.

Signed and Sealed this

Ninth Day of January, 1996

Attest:

BRUCE LEHMAN

Attesting Officer       Commissioner of Patents and Trademarks